United States Patent [19]

Fukuda

[11] 4,221,929

[45] Sep. 9, 1980

[54] SPEAKER SYSTEM

[75] Inventor: Yutaka Fukuda, Tokyo, Japan

[73] Assignee: Sony Corporation, Tokyo, Japan

[21] Appl. No.: 10,822

[22] Filed: Feb. 9, 1979

[30] Foreign Application Priority Data

Feb. 17, 1978 [JP] Japan .......................... 53-19117[U]

[51] Int. Cl.2 .......................... H04R 1/02; H05K 5/00; G10K 11/00; A47B 81/06

[52] U.S. Cl. .......................... 179/1 E; 181/148; 181/175; 181/199

[58] Field of Search ............... 181/171, 148, 153, 175, 181/198, 199; 179/1 E

[56] References Cited

U.S. PATENT DOCUMENTS

| | | | |
|---|---|---|---|
| 3,059,720 | 10/1962 | Matsuoka | 181/153 |
| 3,964,571 | 6/1976 | Snell | 181/199 |
| 3,976,838 | 8/1976 | Stallings, Jr. | 179/1 E |
| 4,006,308 | 2/1977 | Pönsegen | 179/1 E |
| 4,057,689 | 11/1977 | Stallings, Jr. | 179/1 E |

*Primary Examiner*—Cook Daryl W.
*Attorney, Agent, or Firm*—Hill, Van Santen, Steadman, Chiara & Simpson

[57] ABSTRACT

A speaker system in which a speaker unit mounting frame and unit boards are mounted in juxtaposition on a baffle board, and at least a part of the unit board surface contiguous to the surface of the speaker unit mounting frame is bevelled to form a gently-sloping face.

7 Claims, 11 Drawing Figures

SPEAKER SYSTEM

BACKGROUND OF THE INVENTION

1. Field of the Invention

This invention relates to a two-way or three-way speaker system, and more particularly to such speaker system in which a speaker unit mounting frame and unit boards are mounted on a baffle board.

2. Description of the Prior Art

In the conventional two-way or three-way speaker systems, the speaker unit and other associated elements such as phase inverting duct are set in position on a baffle board with the aid of a mounting frame or unit boards. Such speaker unit mounting frame and unit boards are usually mounted independently of each other such that they rise above the baffle board surface. Therefore, there would be inevitably produced a difference in level between the surfaces of said frame and unit boards and the surface of the baffle board, which would given rise to a phenomenon of diffraction of the sound output given out from the speaker, resulting in the deteriorated frequency characteristic.

SUMMARY OF THE INVENTION

This invention has for its general object to provide an improved speaker system of the described type.

More particularly, it is an object of this invention to provide a speaker system in which a baffle board adapted with at least one speaker is further mounted with another speaker unit with the medium of a mounting frame.

It is another object of this invention to provide a speaker system in which the speaker mounting frame and unit boards are provided on a baffle board.

Still another object of this invention is to provide a speaker system in which the speaker unit mounting frame and unit boards are so designed that their surfaces are continuous to the baffle board surface so as to prevent diffraction which might otherwise be caused by the level difference between the surfaces of said frame and unit boards and the surface of said baffle plate.

Yet another object of this invention is to provide a speaker system in which the speaker unit mounting frame and unit boards are disposed in juxtaposition on the baffle board to thereby effectively prevent the phenomenon of diffraction.

A further object of this invention is to provide a speaker system comprising a baffle board adapted with a speaker unit for reproducing the bass register, a speaker unit mounting frame for mounting therein a speaker unit for reproducing the treble register, and unit boards provided each with a phase inverting duct, wherein said frame and unit boards are mounted on the baffle board such that the surfaces of said frame and unit boards will be substantially flush with the surface of said baffle plate, thereby to prevent the diffraction phenomenon and to accentuate the bass register.

An additional object of this invention is to provide a speaker system in which the speaker unit mounting frame and unit boards can be easily mounted in position contiguous to each other on the baffle board.

DESCRIPTION OF THE PREFERRED EMBODIMENTS

The invention is now described in detail with reference to the accompanying drawings.

Figure 1:
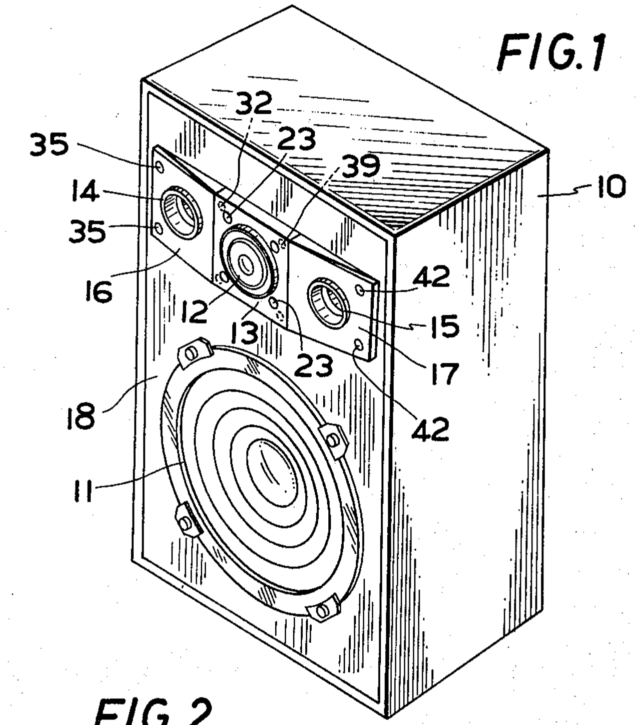
FIG. 1 is a general perspective view of a speaker system according to this invention.

Referring first to FIG. 1, there is shown a perspective view of a first embodiment of the speaker system according to this invention, where it will be seen that a cabinet 10 is provided with a baffle board 18 adapted with a woofer 11 which is to constitute a first speaker unit for reproducing the bass register. Provided on the upper part of said baffle board 18 are a speaker unit mounting frame 13 mounted with a second speaker unit 12 (a tweeter in this embodiment) for reproducing the treble register and a first and a second unit board 16,17 such that they rise above the surface of the baffle board 18. The frame 13 is sandwitched between the first and second unit boards 16,17, with their surfaces being substantially flush with each other, and the end faces of the unit boards 16,17 join smoothly to the surface of the baffle board 18. In this embodiment, the unit boards 16,17 are each provided with an integral phase inverting duct 14, 15 as described later.

The speaker unit mounting frame 13 and the first and second unit boards 16,17 mounted on said baffle board 18 have the structures such as shown in FIGS. 2 through 8.

Figure 2:
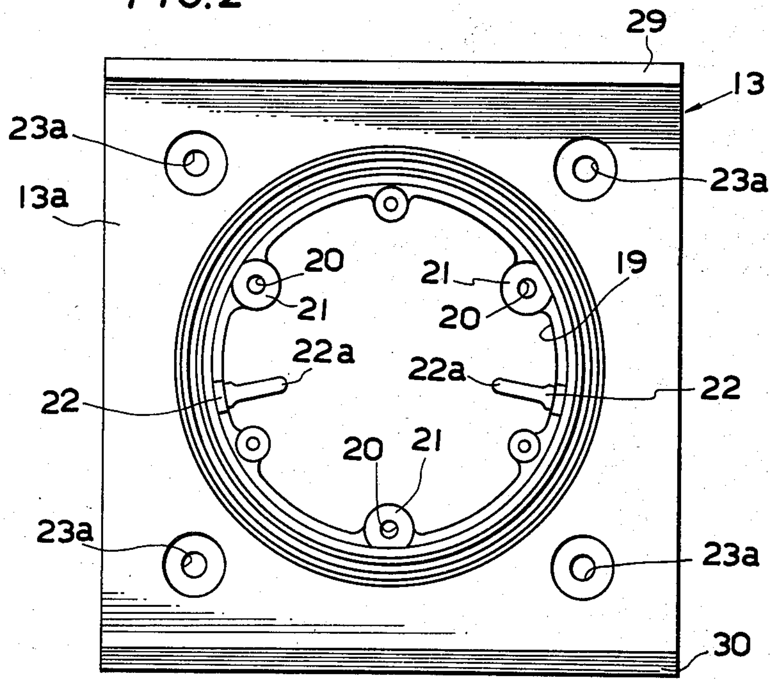
FIG. 2 is an enlarged plane view of a speaker unit mounting frame which constitutes an essential element of this invention.

The speaker unit mounting frame 13, which may be made of plastic for example, is generally configured square as seen from FIG. 2 and provided centrally thereof with an opening 19 in which to set a speaker unit 12 (see FIG. 1). Extending into said opening 19 are the lobes 21 formed each with a hole 20 for passing a fixing member such as screw for fixing the unit 12 in position and the connecting portions 22*a* of the terminal plates 22 for external connection of the lead wires leading from the voice coils of the speaker unit 12. Formed toward the four corners of the mounting frame 13 and positioned close to the periphery of said opening 19 are the holes 23*a* for passing the screws whereby to fix said frame 13 to the baffle board 18.

Figure 3:
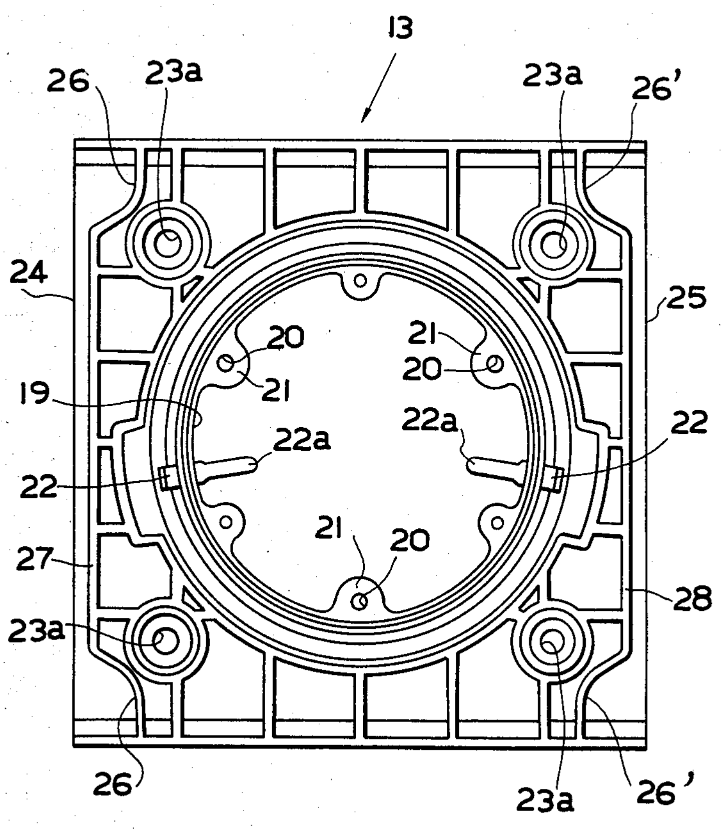
FIG. 3 is a rear view thereof.
Figure 4:
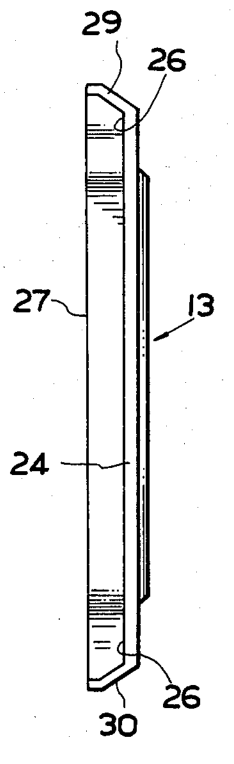
FIG. 4 is a side view thereof.

At the sides of the frame 13 adjoining to the first and second unit boards 16,17 when set on the baffle board 18, there extend the brims 24,25 (see FIG. 3) adapted to cover the portions of said first and second unit boards 16, 17 to be secured to the baffle board 18 as further described later. Also provided close to the proximal ends of said brims 24,25 are the side walls 27,28 each of which has at its both ends the recessions 26 designed to fittingly receive the portions of the first and second unit boards 16,17 to be secured to the baffle board 18, as shown in FIGS. 3 and 4. It is to be also noted that, as shown in FIG. 4, the upper and lower edges 29,30 connecting the said brims 24,25 on the front side of the mounting frame 13 are bevelled so that they smoothly merge into the surface of the baffle board 18 when the frame 13 is mounted on said baffle board.

Figure 5:
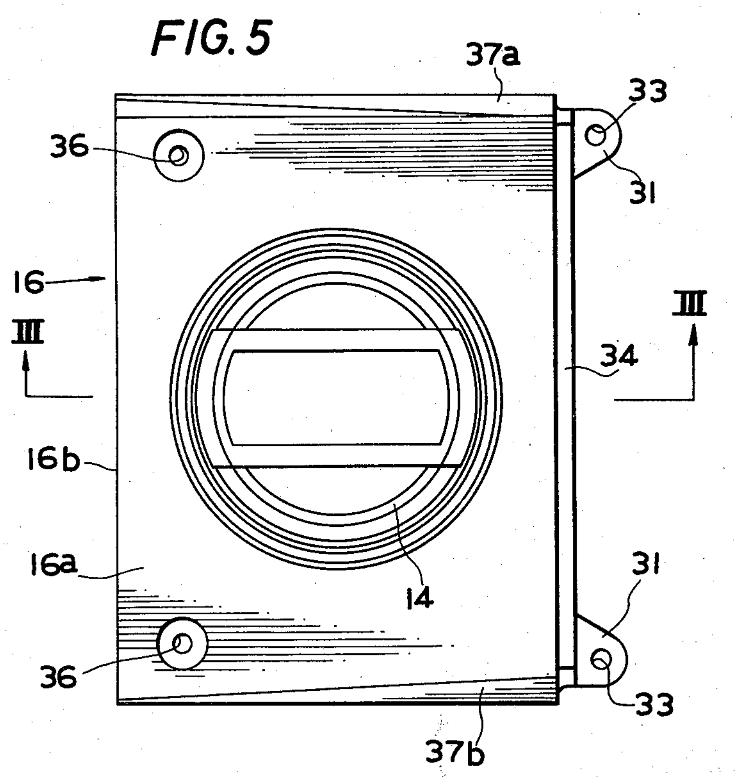
FIG. 5 is an enlarged front view of a first unit board.

The first unit board 16 (best shown in FIG. 5), which is mounted on the baffle board 18 while adjoining to one side of said speaker unit mounting frame 13, is also configured square as seen from FIG. 5. At both ends of one side thereof adjoining to the frame 13 when set on said baffle board 18 are provided the flanges 31,31 which are so designed as to fit in the corresponding recessions 26 formed on the back side of said frame 13 and which are each formed with a hole 33 for passing a screw 32 whereby to secure the unit board 16 to the baffle board 18. At the side of the board 16 provided with said flanges 31,31 is formed a stepped portion 34 which is so designed that it is covered by the brim 24 of the speaker unit mounting frame 13 and that the level difference H between said stepped portion 34 and the board surface is substantially equal to the wall thickness of the brim 24 of the frame 13 so that when said frame 13 and board 16 are set in position on the baffle board 18, the surfaces of said frame 13 and said board 16, or the front side portions 13*a* and 16*a*, will extend smoothly and continuously to each other, without producing any gap of level, so as to form generally a continuous flush surface.

At the corners on the side opposite from the side provided with said flanges 31,31 are formed the holes 36,36 for passing the screws 35,35 whereby to secure the board 16 to the baffle board 18.

Figure 6:
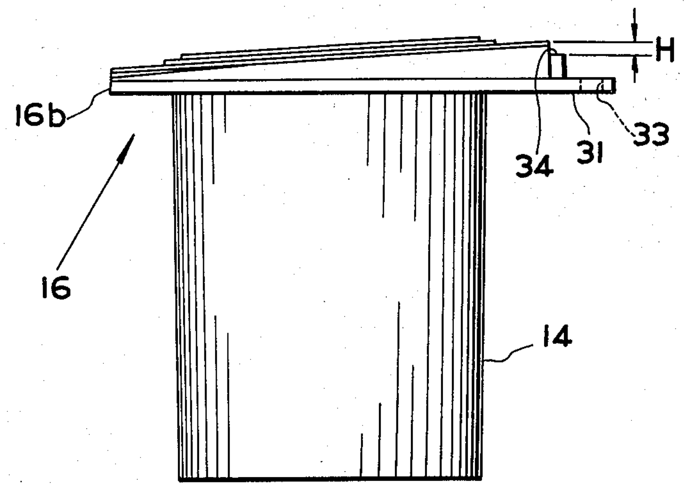
FIG. 6 is a side view thereof.
Figure 7:
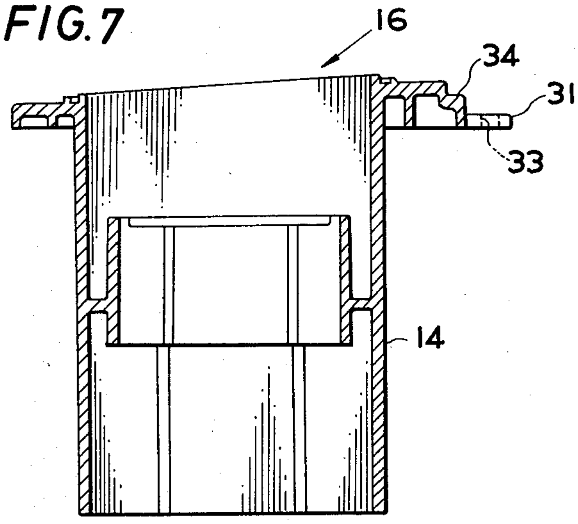
FIG. 7 is a sectional view taken along the line III—III of FIG. 5.

The first unit board 16 is also so worked that its surface slants gradually from its one edge, which adjoins to the speaker unit mounting frame 13 and has a predetermined elevation, toward the opposite edge 16*b* abutting on the surface of the baffle board 18, as shown in FIG. 6, so that when said board 16 is mounted in position on the baffle board 18, the surface 16*a* of said board 16 will substantially evenly connect to the baffle board surface. The upper and lower edges 37*a*,37*b* connecting the said side edges are machined to form a bevel of such configuration that the corner thereof looks like planed off as shown in FIG. 5 so that said bevel will smoothly merge into the surface of the baffle board 18.

Centrally of said first unit board 16 is provided a cylindrical phase inverting duction 14 for accentuating the bass register as shown in FIG. 6. This phase inverting duct 14 is formed integral with the unit board 16 and housed in the cabinet 10 when assembled.

Figure 8:
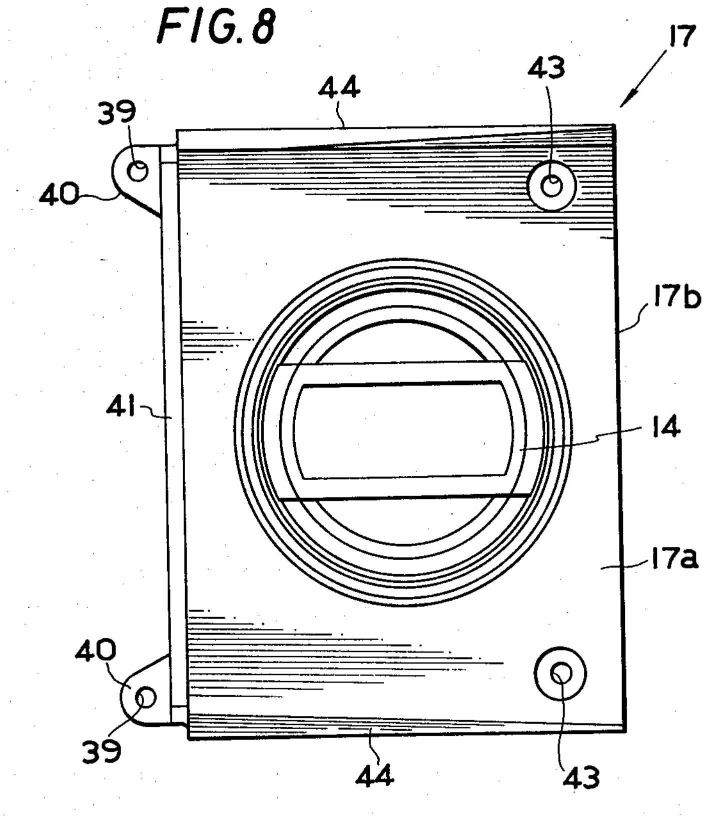
FIG. 8 is an enlarged front view of a second unit board.

The second unit board 17, which is mounted on the baffle board 18 while adjoining to the other side of said speaker unit mounting frame 13, is also provided with an integral phase inverting duct 14 and constructed just symmetrically to the above-described first unit board 16 as shown in FIG. 8. At both ends of one edge adjoining to the speaker unit mounting frame 13 are provided the flanges 40,40 designed to fit into the corresponding recessions 26' of the frame 13, each of said flanges 40 being formed with a screw passing hole 39. There is also formed a stepped portion 41, similar to that of the first unit board 16, on which the brim 25 of the frame 13 is placed. On the side opposite from the side provided with said flanges 40,40 are formed the holes 43,43 for inserting the fixing screws 42,42, and a bevel 44 with its corner looking like planed off is provided at each of the upper and lower edges extending from one side edge to the other.

This second unit board 17, just like said first unit board 16, is so worked that its surface slants gradually from its one edge, which adjoins to the speaker unit mounting frame 13 and has a predetermined elevation, toward the other edge 17*b* which abuts on the surface of the baffle board 18 so that when said board 17 is set in position on the baffle board 18, its surface 17*a* will substantially evenly connected to the surface of said baffle board 18.

When the thus constructed speaker unit mounting frame 13 and the first and second unit boards 16,17 are mounted properly on the baffle board 18 in adjoining relation to each other, the brims 24,25 of the frame 13 are engaged in superposition on the stepped portions 34,41 of the first and second unit boards 16,17 to cover the flanges 31,31 40,40 of said respective boards 16,17 as shown in FIG. 1. Thus, the respective unit boards 13,16,17 are set on the baffle board 18 contiguous to each other as if they were an integral board.

It will be noted that the surface of the speaker unit mounting frame 13 mounted with a tweeter 12 so as to bulge out on the baffle board 18 connects smoothly and continuously to the surface of the baffle board 18 through the slant surfaces 16*a*,17*a* of the first and second unit boards 16,17. Such smooth merger is effected at any of the edges of said frame 13 and first and second unit boards 16, 17 that abut on the surface of the baffle board 18.

Figure 9:
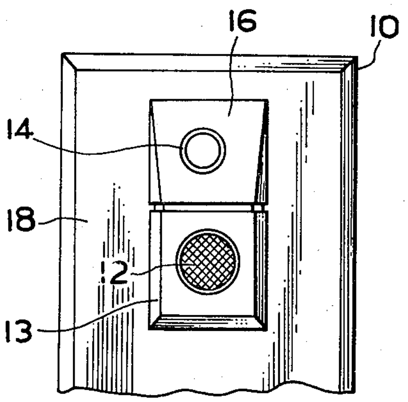
FIG. 9 is a front view showing a part of a speaker system according to another embodiment of this invention.
Figure 10:
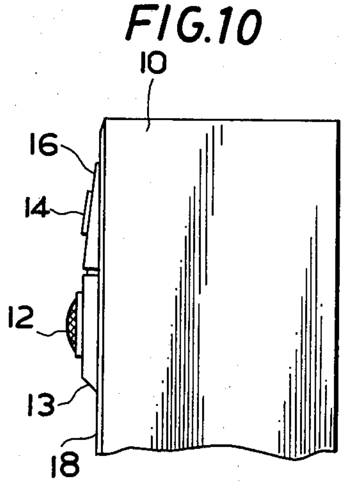
FIG. 10 is a partial side view thereof.

In this invention, the speaker unit mounting frame 13 and the first and second unit boards 16,17 constructed as described above may be arranged vertically relative to the baffle board 18 as shown in FIGS. 9 and 10. Also, where the sound output radiated from the speaker unit mounted in said frame 13 is of certain frequency bands, said frame 13 and first and second unit boards 16,17 may be disposed spaced-apart from each other by a distance safe from inducing diffraction.

In the above-described embodiment, an integral phase inverting duct is mounted to each unit board, but it is also possible to arrange in similar way other speaker components or attachments such as another speaker unit, attenuator, style strip, etc. It is also embraced with the scope of this invention to provide the fixing flanges on the speaker unit mounting frame such that these flanges will be covered by the brims of the unit boards.

Figure 11:
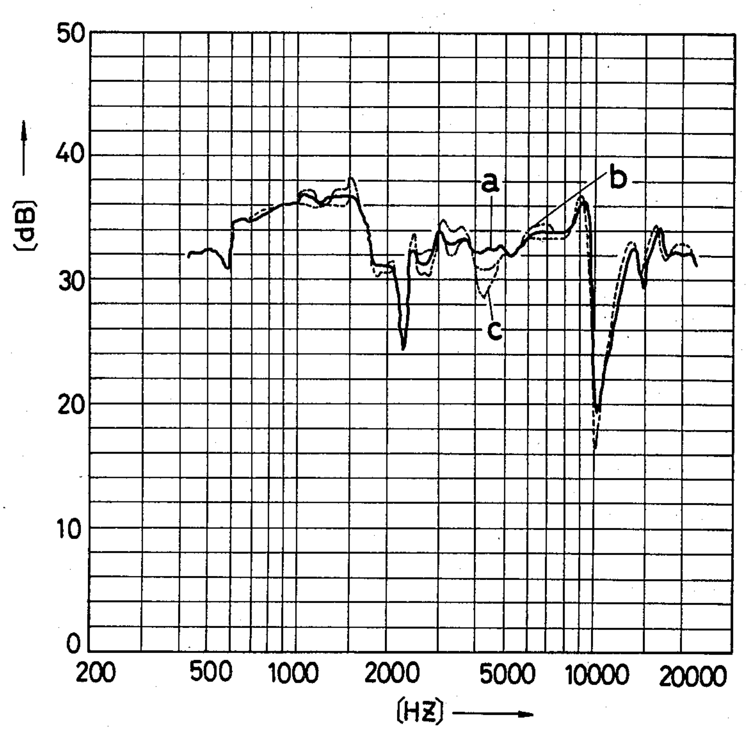
FIG. 11 is a graph showing comparatively the frequency-sound pressure characteristic of a speaker system of this invention and that of a conventional speaker system.

In use of the device of this invention having the above-described construction, the sound output produced from the speaker unit presents a frequency characteristic such as shown by the solid-line curve a in FIG. 11 without giving rise to the phenomenon of diffraction. Also, even when a unit board such as described above is provided only on one side of the speaker unit mounting frame, there is obtained a frequency characteristic such as shown by the single-dotted chain line b in FIG. 11. The broken line curve c shows the frequency characteristic of a conventional device.

It is thus possible to obtain a speaker system improved particularly in the frequency characteristic in the high frequency region in comparison with the conventional devices as seen from FIG. 11, by making arrangement such that the sound output produced from the speaker unit will not cause diffraction as described above.

Further, since the mounting frame and unit boards are engaged in superposed relation at their edges, they can be easily secured to the baffle board by means of common fixing screws. Moreover, as arrangement is made such as to prevent diffraction originating from the speaker unit by the unit boards where a duct is provided, there is no need of separately providing a specific diffraction preventing means.

What is claimed is:

1. A speaker system comprising a baffle board mounted with a first speaker unit, a speaker unit mounting frame mounted on said baffle board so as to rise above the surface of said baffle board, a second speaker unit mounted in said frame, and at least one unit board mounted on said baffle board so as to adjoin to said frame, said unit board having a surface so designed as to substantially evenly connect the surface of said speaker unit mounting frame and the surface of said baffle board, thereby to prevent diffraction of the sound wave originated from the speaker unit provided in said frame.

2. A speaker system according to claim 1, further comprising a second unit board, wherein said first and second unit boards are mounted on said baffle board such that said speaker unit mounting frame is sandwitched therebetween, said second unit board having a surface so designed as to substantially evenly connect the surface of said speaker unit mounting frame and the surface of said baffle board.

3. A speaker system acording to claim 1, wherein the surface of said speaker unit mounting frame is plane and the surface of said unit board is slant.

4. A speaker system according to claim 1 or 2, wherein each said unit board is provided centrally thereof with an integral phase inverting duct.

5. A speaker system according to claim 1, wherein at least one of said unit board and speaker unit mounting frame is provided with the flanges having each a screw hole and abutting on the opposing edge of the other member, and the other of said unit board and mounting frame is provided with a brim designed to cover said flanges and also formed with the screw holes registering with those in said flanges, and wherein said speaker unit mounting frame and said unit board are secured in common to said baffle board by the screws driven through said screw holes.

6. A speaker system according to claim 1 or 2, wherein said speaker unit mounting frame is tapered at its edges other than the one (or ones) adjoining to said unit board (or boards) so that the tapered edges smoothly merge into the surface of said baffle board.

7. A speaker system according to claim 2, wherein each of said first and second unit boards is provided with an integral phase inverting duct, and said first and second speaker units are arranged in alignment with each other.

* * * * *